United States Patent [19]
Akagi et al.

[11] 4,101,440
[45] Jul. 18, 1978

[54] CHEMICALLY DIGESTIVE AGENTS

[75] Inventors: Motoo Akagi; Hazime Morishita; Saburo Nonogaki, all of Tokyo; Makoto Tanaka, Koganei; Tadao Kaneko, Tokyo all of Japan

[73] Assignee: Hitachi, Ltd., Japan

[21] Appl. No.: 705,529

[22] Filed: Jul. 15, 1976

[30] Foreign Application Priority Data

Jul. 23, 1975 [JP] Japan .................................. 50-89248
Nov. 25, 1975 [JP] Japan ................................. 50-140215

[51] Int. Cl.² .......................... C01B 15/02; H04N 9/60
[52] U.S. Cl. ..................................... 252/186; 96/36.1; 252/79.2; 252/94; 423/272
[58] Field of Search ..................... 252/186, 79.2, 94; 423/272, 273, 274; 96/35.1, 36.1

[56] References Cited

U.S. PATENT DOCUMENTS

| | | | |
|---|---|---|---|
| 3,412,023 | 11/1968 | Jenks | 252/79.2 |
| 3,442,810 | 6/1969 | Elbreder | 252/79.2 |
| 3,483,050 | 12/1969 | Banush | 252/79.2 |
| 3,953,263 | 4/1976 | Ishikawa | 252/79.2 |
| 3,960,560 | 6/1976 | Sato | 252/79.2 |

*Primary Examiner*—Benjamin R. Padgett
*Assistant Examiner*—Irwin Gluck
*Attorney, Agent, or Firm*—Craig & Antonelli

[57] ABSTRACT

A chemically digestive agent for releasing photoresist films comprising hydrogen peroxide and sulfamic acid is particularly suitable for the production of the fluorescent screen of a black matrix color television image receiving tube in that it has a strong releasing action for various photoresist films and low corrosiveness for machinery and appliances. The addition of a fixed amount of iron ion can further improve the characteristics of the chemically digestive agent.

19 Claims, No Drawings

CHEMICALLY DIGESTIVE AGENTS

BACKGROUND OF THE INVENTION

The present invention relates to a chemically digestive agent which is usable for the release of cured photoresist films. Particularly, the invention pertains to a chemically digestive agent which can give good results when used in the production of a black matrix color television image receiving tube.

The fluorescent screen of a black matrix color television image receiving tube has such a structure as many fluorescent substance dots of the three primary colors, that is, red, blue and green are arranged on the internal surface of a glass panel and the gap between the respective fluorescent substance dots has been filled with a non-luminescent light-absorptive substance such as carbon.

Processes for the production of such a fluorescent screen of a black matrix color television image receiving tube are disclosed in many prior art references such as, for example, U.S. Pat. No. 3,558,310. A representative process of production is briefly explained below.

Cured photoresist dots having the same shape and the same size as those of fluorescent substance dots are produced on the internal surface of a glass panel at positions for the fluorescent substance dots to be formed by coating a photoresist onto the internal surface of the glass panel, drying, exposing to light through a shadow mask and then developing. A suspension of carbon is then coated onto the whole surface and dried to form a carbon film over the whole surface. The said cured photoresist dots are removed with a chemically digestive agent together with the carbon deposited thereonto. The resulting holes (which are called by "matrix holes") are respectively filled with fluorescent substances of the three primary colors, that is, red, blue and green to form fluorescent substance dots. The gap between the fluorescent substance dots is then filled up with carbon to form a fluorescent screen of a black matrix color television image receiving tube.

If the removal of the cured photoresist dots with a chemically digestive agent in the above-mentioned step of producing the fluorescent screen of the black matrix color television image receiving tube is inadequate, the shape and size of the respective fluorescent substance dots become uneven and unevenness in color occurs. Also, the carbon remains in the fluorescent substance dots, resulting in a remarkable reduction in quality of picture.

As a chemically digestive agent for removing the cured photoresist film, there has heretofore generally been used as aqueous solution of hydrogen peroxide or hypochlorous acid or a salt thereof.

Since aqueous hydrogen peroxide is weak in an activity of decomposing a cured photoresist film oxidatively, however, the shape and size of matrix holes (correspondingly fluorescent substance dots formed by filling the matrix holes) become uneven and the carbon which has remained without being removed is contained in the fluorescent substance dots in the case of hydrogen peroxide, resulting in a remarkable reduction in quality of picture.

Also, hypochlorous acid and salts thereof are excellent in an ability of removing cured photoresist films, but they are very inconvenient in practical use in that not only they generate toxic chlorine gas during operation but also they corrode remarkably the equipment and appliances for the production of a color television image receiving tube.

SUMMARY OF THE INVENTION

An object of the present invention is to provide a chemically digestive agent which can solve the above-mentioned problems of the prior arts and can remove a cured photoresist film rapidly and in which there is no possibility of the generation of any toxic gas and the corrosion of an apparatus and appliances.

In order to accomplish the above-mentioned object, a liquid obtained by adding sulfamic acid to aqueous hydrogen peroxide is used as a chemically digestive agent according to the present invention. When a fixed amount of iron ion is added thereto, the characteristics of the chemically digestive agent can further be improved.

DETAILED DESCRIPTION

As described above, hypochlorous acid and aqueous hydrogen peroxide which have heretofore been used as a chemically digestive agent have problems awaiting solution with respect to the corrosiveness for machinery and appliances and an ability to release cured photoresist films. Therefore, an attempt to enhance the photoresist film releasing ability by the addition of an inorganic acid such as sulfuric acid to aqueous hydrogen peroxide has been proposed. In order to be of practical use as a chemically digestive agent, however, it is necessary to take into consideration not only the photoresist film releasing ability but also the corrosiveness for machinery and appliances and the safety of operators, and the optimum kind and concentration range of the acids must be found to satisfy these conditions.

Table 1 shows the photoresist film releasing ability and the corrosiveness for iron of 1/100 molar solutions of various acid containing 1% of hydrogen peroxide.

The photoresist film releasing ability was measured by coating onto a glass plate a photoresist produced by using a bisazide as a photo-crosslinking agent and polyacrylamide as a water-soluble polymer, irradiating the coated photoresist with light to cure it, immersing the cured photoresist in the above-mentioned solutions at 60° C for 2 minutes, and then comparing the state of the cured photoresist film.

Also, the corrosiveness was measured by immersing an iron foil, which has not been subjected to rust preventive treatment, in the above-mentioned solutions at 60° C for 6 hours and then comparing the state of the iron foil.

Table 1

| Acid | Corrosiveness | Photoresist film releasing property |
|---|---|---|
| Hydrochloric acid | X | ○ |
| Nitric acid | X | ○ |
| Sulfuric acid | Δ | Δ |
| Sulfamic acid | ○ | ○ |
| Acetic acid | Δ | Δ |

Note: ○:Good Δ:Slightly poor X:Poor

As is clear from the results as shown in Table 1, only sulfamic acid, among the above-mentioned various acids, satisfies both the two conditions, that is, the photoresist film releasing property is good and the corrosiveness for iron is low when used together with aqueous hydrogen peroxide. Also, hydrochloric acid, nitric acid and acetic acid all have a very unpleasant and toxic stimulative odor. In this respect, sulfamic acid having no such stimulative odor is excellent in practicability.

As the photoresist to be released and removed, several photoresists such as one obtained by using a bisazide as a photo-crosslinking agent and polyvinyl pyrrolidone as a water-soluble polymer and one produced by using ammonium bichromate as a photo-crosslinking agent and polyvinyl alcohol as a water-soluble polymer were tested in addition to the photoresist of the above-mentioned composition. The chemically digestive agent of the present invention showed good releasing property for all of these photoresists. Particularly, the chemically digestive agent of the present invention was effective in the release of photoresists, obtained by using a bisazide as a photo-crosslinking agent, for which prior art chemically digestive agents were difficult to obtain good results.

Also, in order to improve the adhesiveness of the photoresist and glass, the addition of a small amount of a silane to the photoresist have often been carried out. In such a case, it has been very difficult to release the cured photoresist completely. However, the chemically digestive agent of the present invention shows very excellent releasing property for such photoresists containing a silane as for the above-mentioned photoresists. This is one of the great advantages of the chemically digestive agent according to the present invention.

In the chemically digestive agent according to the present invention, it is necessary that the concentrations of sulfamic acid and hydrogen peroxide and a ratio of the amount of sulfamic acid contained to the amount of hydrogen peroxide contained are within a definite range, respectively.

Thus, the concentrations of hydrogen peroxide and sulfamic acid must be respectively 0.05 to 10% by weight and 0.001 to 5% by weight. Also, a ratio of the amount of hydrogen peroxide contained to the amount of sulfamic acid contained must be 1 : 0.001 to 1 : 2.

If the concentrations of hydrogen peroxide and sulfamic acid are lower than the above-mentioned ranges, the time required for the release of the photoresist is remarkably prolonged and the practical use of the chemically digestive agent becomes difficult. Also, if the concentrations are higher than the above-mentioned ranges, it is undesirable in that it is necessary to take care of handling in spite of the fact that the photoresist releasing ability can not be so improved. When the concentrations are within the above-mentioned ranges, respectively, the pH of the chemically digestive agent is about 1.5 to 5.0. The practically most preferable concentration ranges are 0.5 to 1.0% by weight for hydrogen peroxide and 0.05 to 0.1% by weight for sulfamic acid.

If the ratio of the amount of hydrogen peroxide contained to the amount of sulfamic acid contained is beyond the above-mentioned range, to photoresist releasing ability remarkably decreases and various undesirable effects are produced. For example, the time required for the release of the cured photoresist film is remarkably prolonged, carbon remains in the fluorescent substance dots, and the size and shape of the fluorescent substance dots become uneven. Therefore, a ratio of the amount of hydrogen peroxide contained to the amount of sulfamic acid contained must be within the above-mentioned range.

Although the chemically digestive agent according to the present invention has a very excellent ability of removing the cured film of various photoresists as described above, the photoresist film releasing speed can be further increased by adding a very small amount of iron ion (which may be either ferrous ion or ferric ion) to the chemically digestive agent having the above-mentioned composition.

The reason why the release of photoresist films is accelerated by the presence of a very small amount of iron ion is not clear, but it is presumed that the iron ion may act as a catalyst when the photoresist is oxidized by the chemically digestive agent.

It is necessary that the amount of iron ion added to the chemically digestive agent is 0.0001 to 0.01% by weight. If the amount of iron ion is less than 0.0001% by weight, the effect of the addition of iron ion is remarkably reduced. Also, if the amount of iron ion is more than 0.01% by weight, the iron ion is undesirably converted to a hydroxide or oxide and becomes easy to be suspended. Also, even if the above-mentioned amount of iron ion is added, the pH of the chemically digestive agent remains substantially unchanged, in other words, is about 1.5 to 5.0.

The following examples illustrate the present invention.

EXAMPLE 1

A photoresist having the composition 1 as described below was coated onto the internal surface of a glass panel by rotary coating method and then dried. The resulting dried coating was exposed through a shadow mask (mask hole diameter 0.325 mm, mask pitch 0.6 mm) to a light from a superhigh pressure mercury-arc lamp at 200 lux for 90 seconds. Development was then carried out by water spraying for about 2 minutes to form cured photoresist dots. A suspension of carbon was then coated onto the whole surface and dried. The thus treated glass panel was immersed in a chemically digestive agent containing various concentrations of hydrogen peroxide and sulfamic acid at 60° C for 2 minutes and the release state of the cured photoresist dots was examined. Also, for comparison, similar tests were carried out with regard to an aqueous solution containing hydrogen peroxide alone or sulfamic acid alone.

As a result, as shown in Table 2, all the chemically digestive agents containing hydrogen peroxide and sulfamic acid at the above-mentioned concentration ranges and the above-mentioned ratio of the amount of hydrogen peroxide contained to the amount of sulfamic acid contained showed excellent releasing action. On the other hand, the releasing action of solutions containing hydrogen peroxide alone and sulfamic acid alone was remarkably lower.

Composition 1

| | | |
|---|---|---|
| Acrylamide-diacetone acrylamide copolymer | 12 | g |
| Sodium 4,4'-diazidostilben-2,2'-disulfonate | 3 | g |
| N-(β-Aminoethyl)-γ-aminopropyltrimethoxysilane (manufactured by Shin-etsu Chemical Industry Co., Ltd, the trademark KBM 603) | 12 | μl |
| Ethylene glycol | 4.8 | g |
| Polyoxyethyleneoctylphenolether (manufactured by Kao-Atlas Chemical Co., trademark Emulgen 810) | 180 | mg |
| Pure water | 988 | g |

Table 2

| Hydrogen peroxide content (% by weight) | Sulfamic acid content (% by weight) | Ratio of hydrogen peroxide to sulfamic acid | Photoresist film releasing property |
|---|---|---|---|
| 1.0 | 0.001 | 1 : 0.001 | ○ |
| 1.0 | 0.01 | 1 : 0.01 | ○ |
| 1.0 | 0.1 | 1 : 0.1 | ○ |
| 1.0 | 1.0 | 1 : 1 | ○ |
| 5.0 | 0.1 | 1 : 0.02 | ○ |
| 0.5 | 0.1 | 1 : 0.2 | ○ |
| 0.05 | 0.1 | 1 : 2 | ○ |
| 9.95 | 5.0 | 1 : 0.2 | ○ |
| 5.0 | 0.5 | 1 : 0.1 | ○ |
| 1.0 | 0.1 | 1 : 0.1 | ○ |
| 0.5 | 0.05 | 1 : 0.1 | ○ |
| 0.2 | 0.02 | 1 : 0.1 | ○ |
| 0.1 | 0.01 | 1 : 0.1 | ○ |
| 0.05 | 0.005 | 1 : 0.1 | ○ |
| 1.0 | 0 | — | X |
| 0 | 1.0 | — | X |

Note: ○ :Good X:Poor

Further, a similar comparison was carried out with regard to a photoresist having the composition 2 as shown below and a photoresist obtained by using ammonium bichromate as a photo-crosslinking agent and polyvinyl alcohol as a water-soluble polymer, and the same results as shown in Table 2 were obtained.

Composition 2

| | | |
|---|---|---|
| A 5% aqueous polyvinyl pyrrolidone solution | 141 | g |
| A 1% aqueous polyacrylamide solution | 494 | g |
| Sodium 4,4'-diazidostilbene-2,2'-disulfonate | 3 | g |
| N-($\beta$-Aminoethyl)-$\gamma$-aminopropyl-trimethoxysilane | 12 | μl |
| Ethylene glycol | 4.8 | g |
| Polyoxyethyleneoctylphenolether (manufactured by Kao-Atlas Chemical Co., trademark Emulgen 810) | 180 | mg |
| Pure water | 365 | g |

EXAMPLE 2

To a solution containing 1% by weight of hydrogen peroxide and 0.1% by weight of sulfamic acid were added different amounts within a range of 0.0001 to 0.005% by weight as ferrous ion of ammonium ferrous sulfate. The releasing ability of the mixtures thus obtained for the cured dots of the photoresists having the compositions 1 and 2 as shown in Example 1 was examined. The cured photoresists were produced in the same manner as in Example 1.

As a result, the time required for the complete release of the dots when the chemically digestive agent containing 0.0001% by weight of ferrous ion was used was about 60% of the time required when the chemically digestive agent contained no ferrous ion. Also, the time required for the release of the dots when the chemically digestive agent contained 0.005% by weight of ferrous ion was about 30% of the time required when the chemically digestive agent contained no ferrous ion. Thus, it was observed that a remarkable effect was produced by the addition of ferrous ion. Also, when ammonium ferric sulfate was added in place of ammonium ferrous sulfate, almost the same results were obtained.

What is claimed is:

1. A chemically digestive agent for releasing photoresist films, said agent comprising hydrogen peroxide and sulfamic acid, wherein the amounts of said hydrogen peroxide and sulfamic acid contained are 0.5 to 10% by weight and 0.001 to 5% by weight, respectively, and a ratio of the amount of the hydrogen peroxide contained to the amount of the sulfamic acid contained is 1:0.001 to 1:2.

2. A chemically digestive agent for releasing photoresist films according to claim 1, wherein said chemically digestive agent has a pH of about 1.5 to 5.

3. A chemically digestive agent for releasing photoresist films according to claim 1, wherein said chemically digestive agent further comprises ionic iron in an amount of 0.0001 to 0.01% by weight.

4. A chemically digestive agent according to claim 1, wherein the hydrogen peroxide is present in an amount of 0.05 to 1% by weight.

5. A chemically digestive agent for releasing photoresist films, said agent consisting essentially of hydrogen peroxide, sulfamic acid and the balance water wherein the amounts of said hydrogen peroxide and sulfamic acid contained are 0.5 to 10% by weight and 0.001 to 5% by weight, respectively, and a ratio of the amount of the hydrogen peroxide contained to the amount of the sulfamic acid contained is 1:0.001 to 1:2.

6. A chemically digestive agent according to claim 5, wherein said agent has a pH of about 1.5 to 5.

7. A chemically digestive agent according to claim 5, wherein the hydrogen peroxide is present in an amount of 0.5 to 1.0% by weight and the sulfamic acid is present in an amount of 0.05 to 1% by weight.

8. A chemically digestive agent for releasing photoresist films, said agent consisting essentially of hydrogen peroxide, sulfamic acid, ionic iron and the balance water wherein the amounts of said hydrogen peroxide and sulfamic acid contained are 0.5 to 10% by weight and 0.001 to 5% by weight, respectively, and a ratio of the amount of the hydrogen peroxide contained to the amount of the sulfamic acid contained is 1:0.001 to 1:2, and wherein the amount of ionic iron is 0.0001 to 0.01% by weight.

9. A chemically digestive agent according to claim 8, wherein said agent has a pH of about 1.5 to 5.

10. A chemically digestive agent according to claim 8, wherein the hydrogen peroxide is present in an amount of 0.5 to 1.0% by weight and the sulfamic acid is present in an amount of 0.05 to 1.0% by weight.

11. A process for releasing a photoresist film comprising contacting said photoresist film with a chemically digestive agent, said agent comprising hydrogen peroxide and sulfamic acid wherein the amounts of said hydrogen peroxide and sulfamic acid contained are 0.5 to 10% by weight and 0.001 to 5% by weight, respectively, and a ratio of the amount of the hydrogen peroxide contained to the amount of the sulfamic acid contained is 1:0.001 to 1:2.

12. A process according to claim 11, wherein said agent has a pH of about 1.5 to 5.

13. A process according to claim 11, wherein said agent further comprises ionic iron in an amount of 0.0001 to 0.01% by weight.

14. A process according to claim 11, wherein said photoresist film comprises an acrylamide-diacetone acrylamide copolymer photo-crosslinked by a bisazide.

15. A process according to claim 14, wherein said photoresist film further comprises an adhesive promoting amount of a silane.

16. A process according to claim 15, wherein said silane is N-($\beta$-aminoethyl)-$\gamma$-amino-propyltrimethoxysilane.

17. A process according to claim 11, wherein said photoresist film comprises a mixture of a polyvinyl pyrrolidone polymer and a polyacrylamide polymer, said mixture photo-crosslinked by a bisazide.

18. A process according to claim 17, wherein said photoresist film further comprises an adhesive promoting amount of a silane.

19. A process according to claim 18, wherein said silane is N-($\beta$-aminoethyl)-$\gamma$-aminopropyl-trimethoxysilane.